United States Patent
Zucker et al.

(10) Patent No.: US 11,195,704 B2
(45) Date of Patent: Dec. 7, 2021

(54) PEDESTAL ASSEMBLY FOR PLASMA PROCESSING APPARATUS

(71) Applicants: Mattson Technology, Inc., Fremont, CA (US); Beijing E-Town Semiconductor Technology Co., Ltd., Beijing (CN)

(72) Inventors: Martin L. Zucker, Orinda, CA (US); Tinghao Frank Wang, Santa Cruz, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 113 days.

(21) Appl. No.: 15/936,744

(22) Filed: Mar. 27, 2018

(65) Prior Publication Data

US 2018/0286639 A1  Oct. 4, 2018

Related U.S. Application Data

(60) Provisional application No. 62/479,483, filed on Mar. 31, 2017.

(51) Int. Cl.
  *H01J 37/32* (2006.01)
  *H01L 21/67* (2006.01)
  (Continued)

(52) U.S. Cl.
  CPC ..... *H01J 37/32642* (2013.01); *H01J 37/3211* (2013.01); *H01J 37/32091* (2013.01);
  (Continued)

(58) Field of Classification Search
  CPC ........... H01J 37/32642; H01J 37/32091; H01J 37/3211; H01J 37/32449; H01J 37/32651;
  (Continued)

(56) References Cited

U.S. PATENT DOCUMENTS 6,022,809 A    2/2000 Fan
6,521,292 B1 *  2/2003 Yudovsky ............. C23C 16/455
                                             118/500
(Continued)

FOREIGN PATENT DOCUMENTS

CN    101150044 A    3/2008
CN    102187741 A    9/2011
(Continued)

OTHER PUBLICATIONS

PCT International Search Results and Written Opinion for corresponding PCT Application No. PCT/US2018/02442, dated Jul. 13, 2018—11 pages.

*Primary Examiner* — Ram N Kackar
(74) *Attorney, Agent, or Firm* — Dority & Manning, P.A.

(57) ABSTRACT

Pedestal assemblies for processing apparatus, such as plasma processing apparatus are provided. In one example implementation, a plasma processing apparatus can include a processing chamber having a processing chamber interior. The apparatus can include a plasma source configured to induce a plasma in the processing chamber interior. The apparatus can include a pedestal configured to support a substrate in the processing chamber interior during processing of the substrate. The apparatus can include a focus ring configured to be disposed around a periphery of the substrate when the substrate is supported on the pedestal. The focus ring can have a plurality of uniformly spaced apart slots. Each slot can be configured to engage with a corresponding protrusion located on the pedestal.

11 Claims, 5 Drawing Sheets

(51) Int. Cl.
  *H01L 21/683* (2006.01)
  *H01L 21/687* (2006.01)
(52) U.S. Cl.
  CPC .. *H01J 37/32449* (2013.01); *H01J 37/32651* (2013.01); *H01J 37/32715* (2013.01); *H01L 21/67063* (2013.01); *H01L 21/6831* (2013.01); *H01L 21/68735* (2013.01); *H01J 2237/334* (2013.01)
(58) Field of Classification Search
  CPC .......... H01J 37/32715; H01J 2237/334; H01L 21/68735; H01L 21/67063; H01L 21/6831
  See application file for complete search history.

(56) References Cited

U.S. PATENT DOCUMENTS

| | | | |
|---|---|---|---|
| 7,381,293 B2 | 6/2008 | Wang et al. | |
| 8,382,942 B2 | 2/2013 | Hatamura et al. | |
| 8,405,005 B2 | 3/2013 | Zucker et al. | |
| 8,469,368 B2 | 6/2013 | Kenworthy et al. | |
| 8,801,947 B2 | 8/2014 | Wang et al. | |
| 9,653,264 B2 | 5/2017 | Nagorny et al. | |
| 2002/0036065 A1* | 3/2002 | Yamagishi | H01L 21/67173 156/345.12 |
| 2005/0061447 A1 | 3/2005 | Kim et al. | |
| 2005/0155718 A1 | 7/2005 | Huang et al. | |
| 2015/0107773 A1* | 4/2015 | Shintaku | H01J 37/32275 156/345.41 |
| 2018/0190526 A1* | 7/2018 | Hao | H01L 21/6831 |

FOREIGN PATENT DOCUMENTS

| | | |
|---|---|---|
| CN | 104701126 A | 6/2015 |
| JP | 2005154271 | 6/2005 |
| JP | 2012500498 | 1/2012 |
| JP | 2013125823 | 6/2013 |
| JP | 2014007215 | 1/2014 |
| KR | 20050074701 | 7/2005 |
| KR | 20060018338 | 3/2006 |
| KR | 20150046747 | 4/2015 |
| WO | WO2004027815 | 4/2004 |

* cited by examiner

PEDESTAL ASSEMBLY FOR PLASMA PROCESSING APPARATUS

PRIORITY CLAIM

The present application claims the benefit of priority of U.S. Provisional Application Ser. No. 62/479,483, titled "Pedestal Assembly for Plasma Processing Apparatus," filed Mar. 31, 2017, which is incorporated herein by reference for all purposes.

FIELD

The present disclosure relates generally to pedestal substrate supports in a processing apparatus, such as plasma processing apparatus.

BACKGROUND

Plasma processing tools can be used in the manufacture of devices such as integrated circuits, micromechanical devices, flat panel displays, and other devices. Plasma processing tools used in modern plasma etch applications can be required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g. gas flow, gas pressure, etc.).

Pedestal assemblies can be used to support substrates in a plasma processing apparatus and other processing tools (e.g., thermal processing tools). Pedestal assemblies can include an insulator rings that surround pedestal baseplate(s). Contact between the insulator rings with the pedestal baseplate(s) can have detrimental effects on wafer process uniformity.

A focus ring can be used in conjunction with pedestal assemblies in plasma processing tools. During processing of substrates (e.g., semiconductor wafers), eccentric thermal expansion of the focus ring can have detrimental effects. For instance, there can be reduced process uniformity due to non-uniform electric fields at the edge of the substrate. In some cases, there can be an increased likelihood of arcing in areas of an increased gap between the focus ring and the substrate.

SUMMARY

Aspects and advantages of the invention will be set forth in part in the following description, or may be obvious from the description, or may be learned through practice of the invention.

One example aspect of the present disclosure is directed to a plasma processing apparatus. The plasma processing apparatus includes a processing chamber having a processing chamber interior. The plasma processing apparatus includes a plasma source configured to induce a plasma in the processing chamber interior. The apparatus includes a pedestal configured to support a substrate in the processing chamber interior during processing of the substrate. The apparatus includes a focus ring configured to be disposed around a periphery of the substrate when the substrate is supported on the pedestal. The focus ring can have a plurality of uniformly spaced apart slots. Each slot can be configured to engage with a corresponding protrusion located on the pedestal.

Another example aspect of the present disclosure is directed to a pedestal assembly. The pedestal assembly can include a puck configured to support a substrate. The pedestal assembly can include a baseplate structure configured to support the puck. The baseplate structure can include a bottom insulator comprising an outer diameter registration surface that extends beyond an outer diameter of the baseplate structure. The baseplate structure can include an inner insulator ring at least partially surrounding the baseplate structure. The inner insulator ring can have an inner diameter registration surface configured to contact the outer diameter registration surface of the bottom insulator.

Variations and modifications can be made to example embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to pedestal assemblies for use in conjunction with pedestal supports in a processing apparatus, such as a plasma processing apparatus. A plasma processing apparatus can include a processing chamber. A pedestal can be located within the processing chamber. The pedestal can support a substrate, such as semiconductor wafer during plasma processing. A focus ring can surround the periphery of the substrate on the pedestal and can be used, for instance, to reduce non-uniformity in the plasma process (e.g., etch rate) at or near the periphery of the substrate.

According to example aspects of the present disclosure, the focus ring can have a top surface and an opposing bottom surface. The focus ring can include a plurality of spaced apart slots (e.g., three spaced apart slots) on the bottom surface of the focus ring. The slots can extend radially across at least a portion of the bottom surface of the focus ring. The slots can engage with corresponding protrusions (e.g., pins) located on a top surface of an upper ring structure associated with a pedestal in the processing apparatus. In some embodiments, the upper ring structure can be formed from a quartz material or other material that does not substantially alter its shape during processing as a result of its low thermal expansion coefficient.

Example aspects of the present disclosure can have a number of technical effects and benefits. For instance, during processing, as the focus ring is heated and expands, the uniformly spaced slots on the bottom surface to the focus ring expand radially along the corresponding protrusions located in the top surface of the upper ring structure. As a result, the focus ring remains generally concentric about the substrate during processing. This can lead to improved process uniformity, such as improved uniformity in the etch rate at the periphery of the semiconductor substrate.

In some embodiments, a pedestal assembly can include various components designed to prevent contact with pedestal components (e.g., a puck and baseplate structure) and insulator(s) surrounding the pedestal components. As one example, a pedestal assembly can include a bottom insulator with an outer diameter registration surface that extends slightly beyond an outer diameter of a pedestal baseplate structure. The pedestal assembly can include an inner insulator ring, an outer insulator ring, an upper ring structure and/or a focus ring with registration surfaces configured to reduce and/or prevent contact between the insulators and the vertical surfaces of the baseplate structure and puck. This can lead to improved process uniformity (e.g., etch rate) across a substrate supported by the pedestal assembly during processing.

Aspects of the present disclosure can provide for enhancements to plasma processing apparatus. For instance, one example embodiment of the present disclosure is directed to a plasma processing apparatus. The plasma processing apparatus includes a processing chamber having a processing chamber interior. The plasma processing apparatus includes a plasma source configured to induce a plasma in the processing chamber interior. For instance, in some embodiments, the plasma source can include an inductive coupling element configured to induce a substantially inductive plasma in the processing chamber interior.

The plasma processing apparatus can include a pedestal configured to support a substrate in the processing chamber interior during processing of the substrate. The apparatus includes a focus ring configured to be disposed around a periphery of the substrate when the substrate is supported on the pedestal. The focus ring has a plurality of uniformly spaced apart slots. Each slot can be configured to engage with a corresponding protrusion located on the pedestal.

In some embodiments, each slot extends radially along at least a portion of a bottom surface of the focus ring. Each slot can be uniformly spaced such that during thermal expansion of the focus ring during processing, the focus ring remains concentric about the substrate. In some embodiments, the plurality of uniformly spaced apart slots includes three uniformly spaced apart slots.

In some embodiments, each protrusion is located on an upper ring structure associated with the pedestal, such as a top surface of the upper ring structure. The upper ring structure can include a material with a thermal expansion coefficient that is less than a thermal expansion coefficient associated with the focus ring. For instance, in some embodiments, the upper ring structure can be a quartz material. In some embodiments, each protrusion is a pin.

Another example embodiment of the present disclosure is directed to a focus ring. The focus ring can be used in, for instance, a plasma processing apparatus. The focus ring can have a top surface and an opposing bottom surface. The focus ring can include a plurality of uniformly spaced, radially extending slots disposed on the bottom surface.

In some embodiments, the focus ring can be substantially ring shaped. The focus ring can include three uniformly spaced, radially extending slots. In some embodiments, each slot can extend radially across at least a portion of the bottom surface. In some embodiments, each slot extends to a periphery of the focus ring.

Yet another example embodiment of the present disclosure is directed to a pedestal assembly. The pedestal assembly can be used in, for instance, a plasma processing apparatus. The pedestal assembly can include a puck configured to support a substrate, and a baseplate structure configured to support the puck. The pedestal assembly can include a bottom insulator having an outer diameter registration surface that extends beyond an outer diameter of the baseplate structure. The pedestal assembly can include an inner insulator ring at least partially surrounding the baseplate structure. The insulator ring can have an inner diameter registration surface configured to contact the outer diameter registration surface of the bottom insulator.

In some embodiments, the pedestal assembly includes an outer insulator ring. The inner insulator ring can include a first outer diameter registration surface configured to contact an inner diameter registration surface associated with the outer insulator ring of the pedestal assembly. The pedestal assembly can include an upper ring structure disposed around at least a portion of the puck. The insulator ring can have a second outer diameter registration surface configured to contact an inner diameter registration surface associated with the upper ring structure.

In some embodiments, the upper ring structure can have an outer diameter registration surface configured to contact an inner diameter registration surface associated with a focus ring. In some embodiments, the inner insulator ring does not contact a vertical surface of the baseplate structure.

In some embodiments, the upper ring structure comprises a plurality of uniformly spaced protrusions. Each of the plurality of uniformly spaced protrusions can be configured to engage one of a plurality of uniformly spaced slots formed in a bottom surface of a focus ring. The plurality of uniformly spaced protrusions can include pins. The upper ring structure is a quartz material. The plurality of uniformly spaced protrusions comprises three uniformly spaced protrusions.

Aspects of the present disclosure are discussed with reference to a "workpiece," "substrate" or "wafer" for purposes of illustration and discussion. Those of ordinary skill in the art, using the disclosures provided herein, will understand that the example aspects of the present disclosure can be used in association with any semiconductor substrate or other suitable substrate or workpiece. In addition, the use of the term "about" in conjunction with a numerical value is intended to refer to within 10% of the stated numerical value.

Figure 1:
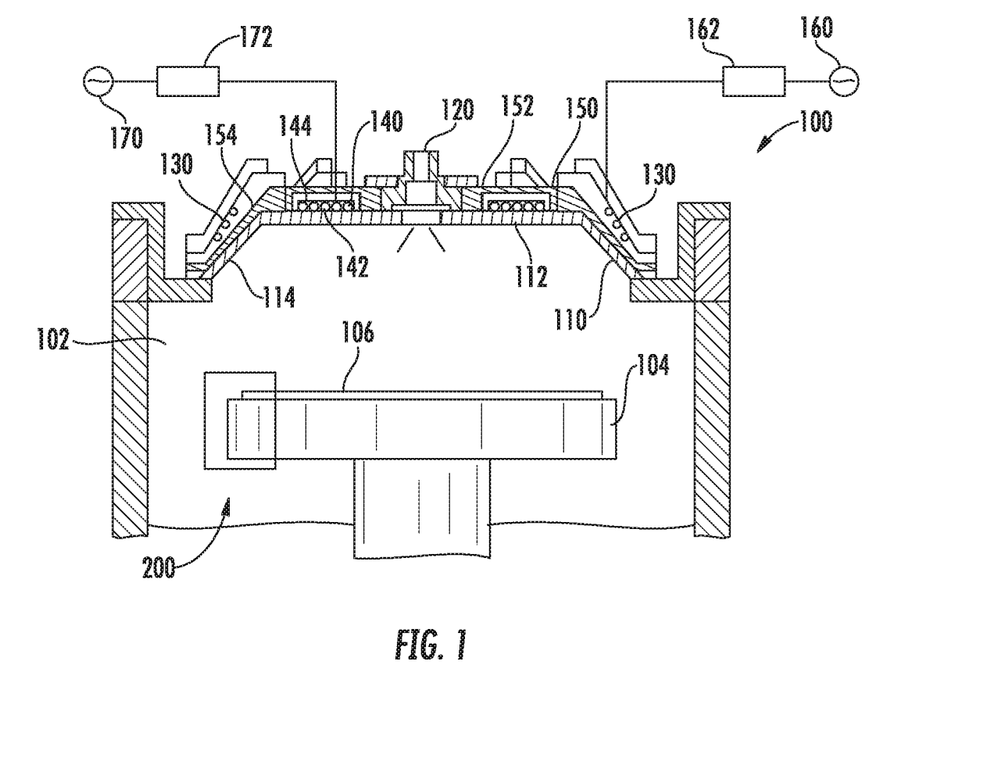
FIG. 1 depicts an example plasma processing apparatus according to example embodiments of the present disclosure.

FIG. 1 depicts a plasma processing apparatus 100 according to example embodiments of the present disclosure. Aspects of the present disclosure is discussed with reference to the plasma processing apparatus 100 depicted in FIG. 1 for purposes of illustration and discussion. Those of ordinary skill in the art, using the disclosures provided herein, will understand that example aspects of the present disclosure can be used with other processing tools and/or apparatus without deviating from the scope of the present disclosure, such as plasma strip tools, thermal processing tools, etc.

The plasma processing apparatus 100 includes a processing chamber defining an interior space 102. A pedestal assembly 104 is used to support a substrate 106, such as a semiconductor wafer, within the interior space 102. A dielectric window 110 is located above the substrate holder 104 and acts as a ceiling of the processing chamber. The dielectric window 110 includes a relatively flat central portion 112 and an angled peripheral portion 114. The dielectric window 110 includes a space in the central portion 112 for a showerhead 120 to feed process gas into the interior space 102.

The apparatus 100 further includes a plurality of inductive elements, such as primary inductive element 130 and secondary inductive element 140, for generating an inductive plasma in the interior space 102. The inductive elements 130, 140 can include a coil or antenna element that when supplied with RF power, induces a plasma in the process gas in the interior space 102 of plasma processing apparatus 100. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140.

While the present disclosure makes reference to a primary inductive element and a secondary inductive element, those of ordinary skill in the art, should appreciate that the terms primary and secondary are used for convenience purposes only. The secondary inductive element can be operated independently of the primary inductive element. The primary inductive element can be operated independently of the secondary inductive element. In addition, in some embodiments, the plasma processing apparatus may only have a single inductive coupling element.

According to aspects of the present disclosure, the apparatus 100 can include a metal shield portion 152 disposed around the secondary inductive element 140. The metal shield portion 152 separates the primary inductive element 130 and the secondary inductive element 140 to reduce cross-talk between the inductive elements 130, 140. Apparatus 100 can further include a first Faraday shield 154 disposed between the primary inductive element 130 and the dielectric window 110. The first Faraday shield 154 can be a slotted metal shield that reduces capacitive coupling between the primary inductive element 154 and the process chamber 102. As illustrated, the first Faraday shield 154 can fit over the angled portion of the dielectric shield 110.

In some embodiments, metal shield 152 and the first Faraday shield 154 can form a unitary body 150 for ease of manufacturing and other purposes. The multi-turn coil of the primary inductive element 130 can be located adjacent the Faraday shield portion 154 of the unitary body metal shield/Faraday shield 150. The secondary inductive element 140 can be located proximate the metal shield portion 152 of metal shield/Faraday shield unitary body 150, such as between the metal shield portion 152 and the dielectric window 110.

The arrangement of the primary inductive element 130 and the secondary inductive element 140 on opposite sides of the metal shield 152 allows the primary inductive element 130 and secondary inductive element 140 to have distinct structural configurations and to perform different functions. For instance, the primary inductive element 130 can include a multi-turn coil located adjacent a peripheral portion of the process chamber. The primary inductive element 130 can be used for basic plasma generation and reliable start during the inherently transient ignition stage. The primary inductive element 130 can be coupled to an RF generator and auto-tuning matching network and can be operated at an increased RF frequency, such as at about 13.56 MHz.

The secondary inductive element 140 can be used for corrective and supportive functions and for improving the stability of the plasma during steady state operation. Since the secondary inductive element 140 can be used primarily for corrective and supportive functions and improving stability of the plasma during steady state operation, the secondary inductive element 140 does not have to be coupled to as powerful an RF generator as the first inductive element 130 and can be designed differently and cost effectively to overcome the difficulties associated with previous designs. As discussed in detail below, the secondary inductive element 140 can also be operated at a lower frequency, such as at about 2 MHz, allowing the secondary inductive element 140 to be very compact and to fit in a limited space on top of the dielectric window.

The primary inductive element 130 and the secondary inductive element 140 can be operated at different frequencies. The frequencies can be sufficiently different to reduce cross-talk in the plasma between the primary inductive element 130 and the secondary inductive element 140. For instance, the frequency applied to the primary inductive element 130 can be at least about 1.5 times greater than the frequency applied to the secondary inductive element 140. In some embodiments, the frequency applied to the primary inductive element 130 can be about 13.56 MHz and the frequency applied to the secondary inductive element 140 can be in the range of about 1.75 MHz to about 2.15 MHz. Other suitable frequencies can also be used, such as about 400 kHz, about 4 MHz, and about 27 MHz. While the present disclosure is discussed with reference to the primary inductive element 130 being operated at a higher frequency relative to the secondary inductive element 140, those of ordinary skill in the art, using the disclosures provided herein, should understand that the secondary inductive element 140 could be operated at the higher frequency without deviating from the scope of the present disclosure.

The secondary inductive element 140 can include a planar coil 142 and a magnetic flux concentrator 144. The magnetic flux concentrator 144 can be made from a ferrite material. Use of a magnetic flux concentrator with a proper coil can give high plasma coupling and good energy transfer efficiency of the secondary inductive element 140, and can significantly reduce its coupling to the metal shield 150. Use of a lower frequency, such as about 2 MHz, on the secondary inductive element 140 can increase skin layer, which also improves plasma heating efficiency.

According to aspects of the present disclosure, the different inductive elements 130 and 140 can carry different functions. Specifically, the primary inductive element 130 can be used to carry out the basic functions of plasma generation during ignition and providing enough priming for the secondary inductive element 140. The primary inductive element 130 can have coupling to both plasma and the grounded shield to stabilize plasma potential. The first Faraday shield 154 associated with the first inductive element 130 avoids window sputtering and can be used to supply the coupling to the ground.

Additional coils can be operated in the presence of good plasma priming provided by the primary inductive element 130 and as such, preferably have good plasma coupling and good energy transfer efficiency to plasma. A secondary inductive element 140 that includes a magnetic flux concentrator 144 provides both a good transfer of magnetic flux to plasma volume and at the same time a good decoupling of the secondary inductive element 140 from the surrounding metal shield 150. The use of magnetic flux concentrators 144 and symmetric driving of the secondary conductive element 140 further reduces the amplitude of the voltage between coil ends and surrounding grounded elements. This can reduce sputtering of the dome, but at the same time gives some small capacitive coupling to plasma, which can be used to assist ignition. In some embodiments, a second Faraday shield can be used in combination with this secondary inductive element 140 to reduce capacitive coupling of the secondary inductive element 140.

Figure 2:
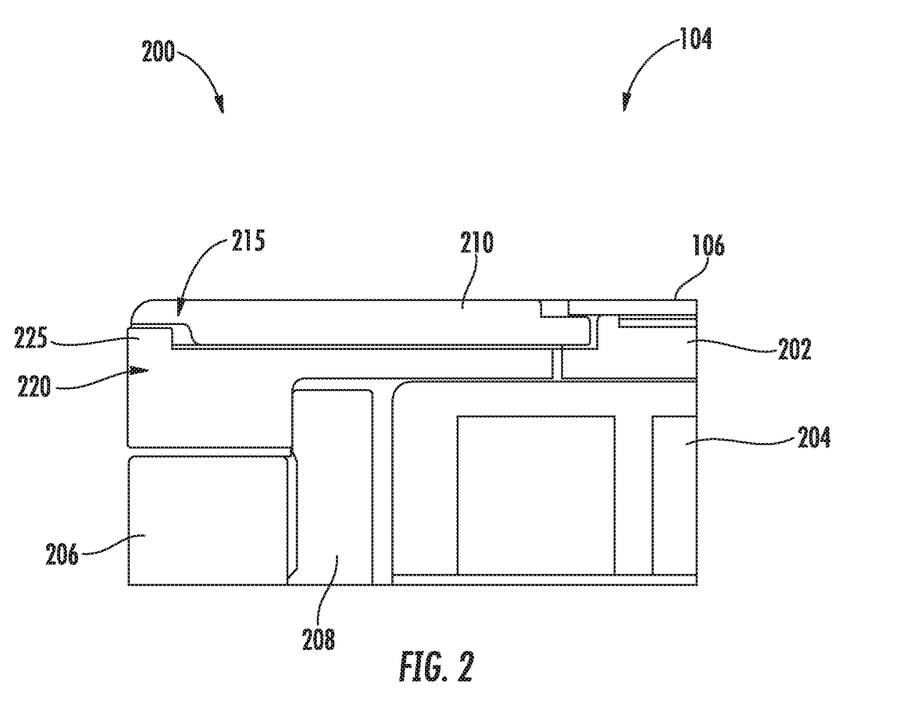
FIG. 2 depicts a close up cross-sectional view of a portion of a pedestal assembly according to example embodiments of the present disclosure.

FIG. 2 depicts a close up view of a portion of pedestal assembly 104 corresponding to window 200 of FIG. 1. As shown, the pedestal assembly 104 can include a puck 202 configured to support a substrate 106, such as a semiconductor wafer. In some embodiments, the puck 202 can include an electrostatic chuck having one or more clamping electrodes configured to hold the substrate via an electrostatic charge. The puck 202 can also include a temperature regulation system (e.g., fluid channels, electric heaters, etc.) that can be used to control a temperature profile across the substrate 106.

The pedestal assembly 104 can include various other structural elements. For instance, the pedestal 104 can include a baseplate structure 204 having one or more pedestal baseplates configured to support the puck 202. The pedestal assembly 104 can include an inner insulator ring 208 disposed about the pedestal baseplate(s) 204 and an outer insulator ring 206.

The pedestal 104 can further include an upper ring structure 220. The upper ring structure 220 can be disposed around at least a portion of the puck 202. The upper ring structure 220 can be disposed on top of the outer insulator ring 206. The upper ring structure 220 can be formed from a material with a low thermal expansion coefficient. For instance, the upper ring structure 220 can be a quartz material.

As illustrated in FIG. 2, a focus ring 210 can be disposed relative to the pedestal 104 such that the focus ring 210 surrounds the substrate 106. The focus ring 210 can be disposed concentric to the substrate 106 such that a center of the focus ring 210 (e.g., the center of an inner space defined by the focus ring 210) corresponds to a center of the substrate 106 (e.g., is within about 20 mm from the center of the substrate, such as about 10 mm from the center of the substrate, such as about 5 mm from the center of the substrate).

According to example aspects of the present disclosure, the focus ring 210 can include features that help the focus ring 210 remain concentric with respect to the substrate 106 during processing of the substrate 106. For instance, the focus ring 210 can include uniformly spaced, radially extending slots 215 that are configured to engage protrusions 225 (e.g., pins) extending from the upper ring structure 220.

Figure 3:
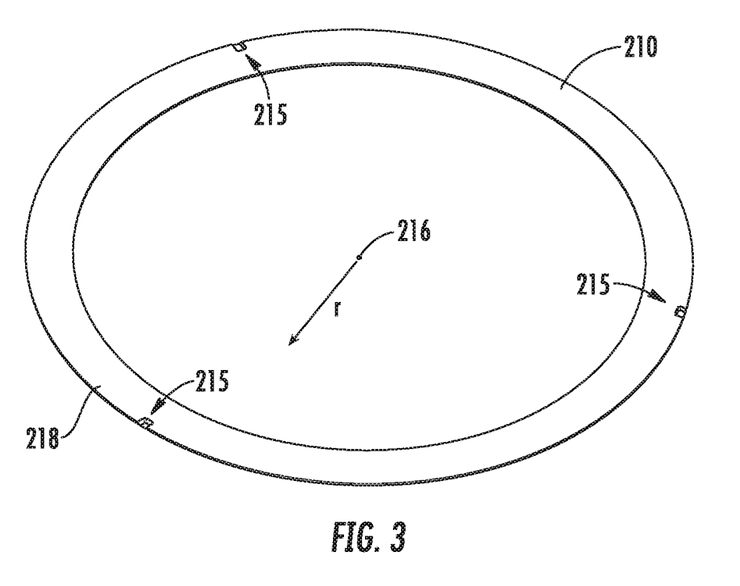
FIG. 3 depicts a perspective view of a bottom surface of a focus ring according to example embodiments of the present disclosure.

More particularly, FIG. 3 depicts a perspective view of a bottom surface of focus ring 210. As shown, the bottom surface of focus ring 210 includes three uniformly spaced slots 215 about the bottom surface of the focus ring 210. Three uniformly spaced slots 215 are illustrated in FIG. 3. Three uniformly spaced slots 215 can provide improved effect in maintaining the focus ring 210 concentric with the substrate 106 during thermal expansion occurring during a plasma process, such as a plasma etch process. However, those of ordinary skill in the art, using the disclosures provided herein, will understand that the focus ring 210 can include more slots 215 without deviating from the scope of the present disclosure.

Figure 4:
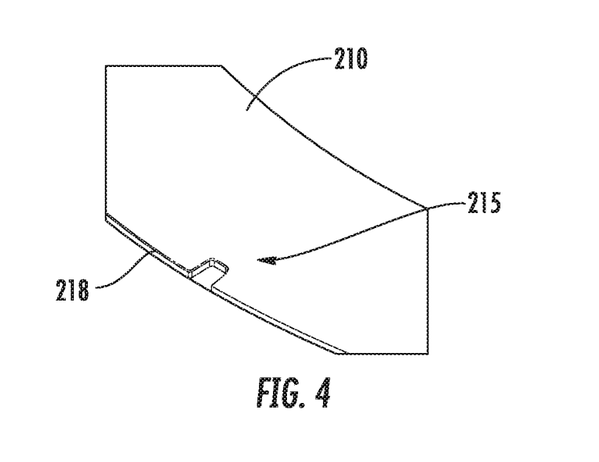
FIG. 4 depicts a close up view of a portion of a bottom surface of a focus ring including a slot according to example embodiments of the present disclosure.

FIG. 4 depicts a close up view of a portion of the bottom surface of the focus ring 210, including an example slot 215. As shown, the slot 215 extends in a radial direction—extends radially from in a direction from a center of a focus ring to an periphery of the focus ring—across the bottom surface of the focus ring 210. As used herein, a slot extends radially or in a radial direction when a the slot has a dimension (e.g., a length dimension or a width dimension) extending in a direction defined by a radius extending from a center 216 of the focus ring 210 to a peripheral edge 218 of the focus ring as illustrated in FIG. 3. An example radial direction is defined by direction "r" in FIG. 3.

Referring to FIG. 4, the slot 215 extends in a radial direction across a portion of the bottom surface of the focus ring 210. The slot 215 extends across a portion of the bottom surface of the focus ring 210 such that the slot 215 extends to a peripheral edge 218 of the focus ring 210. As will be discussed in detail below, the slot 215 can have a shape configured to accommodate and/or engage a protrusion defined in an upper ring structure associated with the pedestal.

Figure 5:
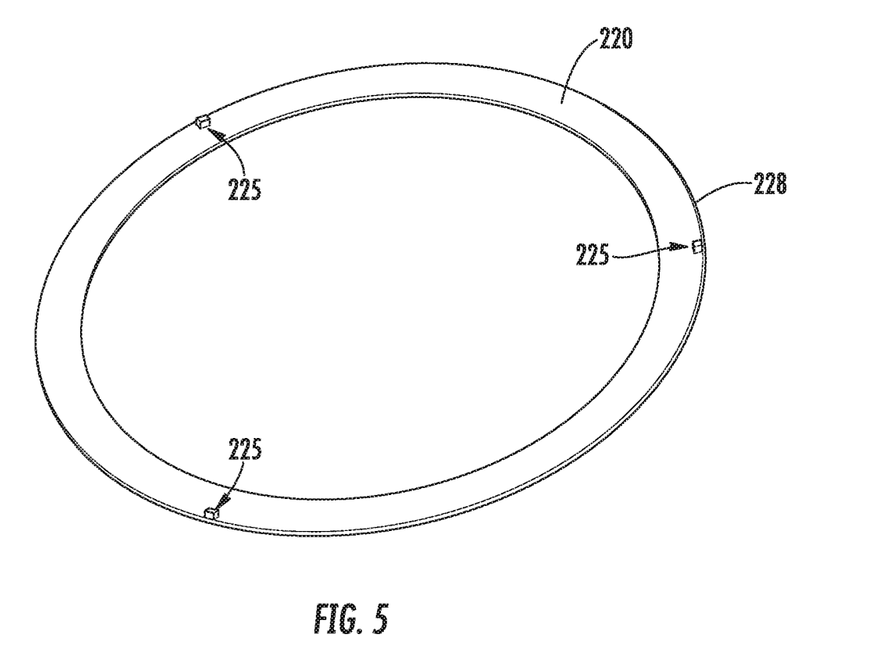
FIG. 5 depicts a perspective view of a top surface of an upper ring structure of a pedestal assembly according to example embodiments of the present disclosure.

More particularly, FIG. 5 depicts a perspective view of a top surface of an upper ring structure 220 according to example embodiments of the present disclosure. As shown, the upper ring structure 220 includes a plurality of uniformly spaced protrusions 225 (e.g., pins) extending from the top surface of the upper ring structure 220. Three uniformly spaced protrusions 225 are depicted in FIG. 5. The number of uniformly spaced protrusions 225 can correspond to the number of slots 215 defined in the bottom surface of the focus ring 210.

Figure 6:
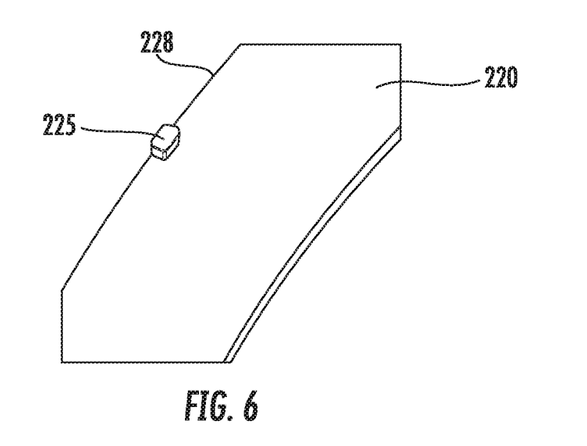
FIG. 6 depicts a close up view of a portion of a top surface of an upper ring structure including a protrusion according to example embodiments of the present disclosure.

FIG. 6 depicts a close up view of a portion of a top surface of an upper ring structure 220 including an example protrusion 225. The protrusion 225 can be formed from the same material as the upper ring structure 220 (e.g., quartz material). The protrusion 225 can be integral with the upper ring structure 220. As shown, the protrusions 225 extend from the upper ring structure 220 at a peripheral edge 228 of the upper ring structure 220. The protrusion 225 can have a shape that is complementary with and/or configured to engage with a slot 215 defined in a bottom surface of a focus ring 210 according to example aspects of the present disclosure.

Referring to FIG. 2, during thermal expansion of the focus ring 210 (e.g., during a plasma etch process) the slots 215 will guide the expansion of the focus ring 210 along the protrusions 225 in a uniform manner so that the focus ring 210 remains concentric with respect to the substrate 106. For example, the upper ring portion 220 can be a material with a thermal expansion coefficient that is less than a thermal expansion coefficient of the focus ring 210. In some embodiments, a coefficient of linear thermal expansion of the upper ring portion 220 can be in the range of about 0.25 to about 0.75, such about 0.55. During processing, the focus ring 210 will expand. However, the upper ring portion 220, including protrusion 225, will remain relatively static relative to the focus ring 210.

During expansion, the protrusion 225 in the upper ring structure 220 will guide the expansion of the focus ring 210 as the slots 215 slide relative to the protrusions 225. The uniform spacing of the slots 215 and protrusions 225 will force expansion of the focus ring 210 in a more uniform manner so that the focus ring 210 remains concentric with the substrate 106. This leads to increased process uniformity during processing of the substrate. For instance, uniformity of etch rate at the periphery of substrate 106 can be improved relative to non-uniform expansion of the focus ring 210.

Figure 7:
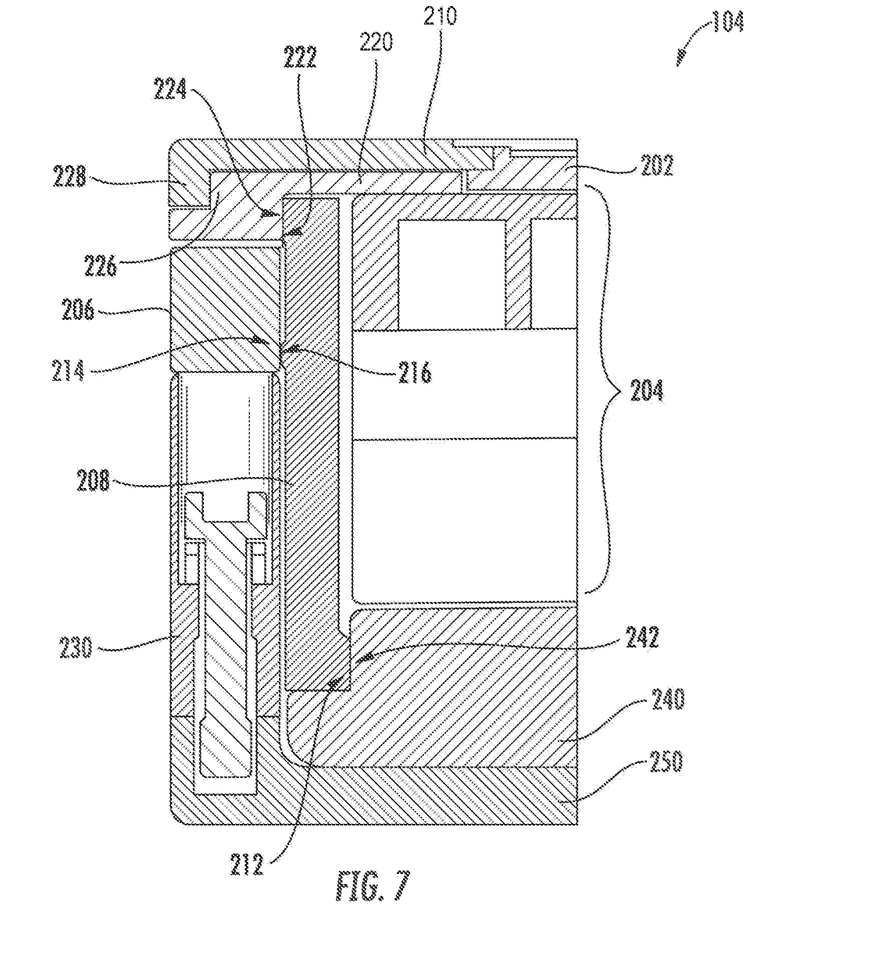
FIG. 7 depicts a close-up cross-sectional view of a portion of a pedestal assembly according to example embodiments of the present disclosure.

FIG. 7 depicts a close up view of a portion of pedestal assembly 104 according to example embodiments of the present disclosure. As shown, the pedestal assembly 104 can include a puck 202 configured to support a substrate 106, such as a semiconductor wafer. In some embodiments, the puck 202 can include an electrostatic chuck having one or more clamping electrodes configured to hold the substrate via an electrostatic charge. The puck 202 can also include a temperature regulation system (e.g., fluid channels, electric heaters, etc.) that can be used to control a temperature profile across the substrate 106.

The pedestal assembly 104 can include various other structural elements. For instance, the pedestal 104 can include a baseplate structure having one or more pedestal baseplates 204 configured to support the puck 202. The pedestal assembly 104 can include an inner insulator ring 208 disposed about the pedestal baseplate(s) 204 and an outer insulator ring 206. The pedestal assembly 104 can include a bottom insulator 240 located below the baseplate structure 204. The pedestal assembly 104 can further include a clamp ring 230 and a ground shield 250. The ground shield 250 can be grounded.

The pedestal 104 can further include an upper ring structure 220. The upper ring structure 220 can be disposed around at least a portion of the puck 202. The upper ring structure 220 can be disposed on top of the outer insulator ring 206. The upper ring structure 220 can be formed from a material with a low thermal expansion coefficient. For instance, the upper ring structure 220 can be a quartz material. A focus ring 210 can be disposed on top of the ring structure such that the focus ring 210 surrounds a substrate 106.

According to example aspects of the present disclosure, components of the pedestal assembly 104 can include various registration surfaces such that the inner insulator ring 208 does not contact any vertical surfaces of the baseplate structure 204. In addition, the upper ring structure 220 and the focus ring 210 do not contact any vertical surfaces of the puck 202. This can lead to improved process uniformity during processing of a substrate 106.

More particularly, the bottom insulator 240 can include an outer diameter registration surface 242 that extends slightly beyond an outer diameter of the baseplate structure 204. The inner insulator ring 208 includes an inner diameter registration surface 212 that is configured to engage or contact the outer diameter registration surface 242 of the bottom insulator 240.

The inner insulator ring 208 can further include a first outer diameter registration surface 216. The first outer diameter registration surface 216 can be configured to contact or engage an inner diameter registration surface 214 associated with the outer insulator ring 206. The inner insulator ring 208 can further include a second outer diameter registration surface 222. The second outer diameter registration surface 222 can be configured to engage or contact an inner diameter registration surface 224 associated with the upper ring structure 220.

The upper ring structure 220 can include an outer diameter registration surface 226. The outer diameter registration surface 226 can be configured to engage or contact an inner diameter registration surface 228 associated with the focus ring 210. In this way, the inner insulator ring 208, the upper ring structure 220, and the focus ring 210 avoid contact with the vertical surfaces of the baseplate structure 204 and the puck 202.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A plasma processing apparatus comprising:
    a processing chamber having a processing chamber interior;
    a plasma source configured to induce a plasma in the processing chamber interior;
    a pedestal configured to support a substrate in the processing chamber interior during processing of the substrate;
    a focus ring configured to be disposed around a periphery of the substrate when the substrate is supported on the pedestal;
    wherein the focus ring has a plurality of spaced apart slots, each slot configured to engage with a corresponding protrusion of a plurality of protrusions located on the pedestal, and wherein a portion of the pedestal having the plurality protrusions comprises a material with a thermal expansion coefficient that is less than a thermal expansion coefficient associated with the focus ring.

2. The apparatus of claim 1, wherein each slot extends radially along at least a portion of a bottom surface of the focus ring.

3. The apparatus of claim 1, wherein the plurality of spaced apart slots are is uniformly spaced, such that during thermal expansion of the focus ring during processing, the focus ring remains concentric about the substrate.

4. The apparatus of claim 3, wherein the plurality of uniformly spaced apart slots comprise three uniformly spaced apart slots.

5. The apparatus of claim 1, wherein each protrusion is located on an upper ring structure associated with the pedestal.

6. The apparatus of claim 5, wherein the upper ring structure comprises a material with a thermal expansion coefficient that is less than the thermal expansion coefficient associated with the focus ring.

7. The apparatus of claim 6, wherein the upper ring structure comprises a quartz material.

8. The apparatus of claim 1, wherein each protrusion is a pin.

9. The apparatus of claim 1, wherein the plasma source comprises an inductive coupling element configured to induce a substantially inductive plasma in the processing chamber interior.

10. A pedestal assembly for use in a processing apparatus, the pedestal assembly comprising:
- a puck configured to support a substrate;
- a baseplate structure configured to support the puck;
- a bottom insulator comprising an outer diameter registration surface that extends beyond an outer diameter of the baseplate structure;
- an inner insulator ring at least partially surrounding the baseplate structure, the insulator ring having an inner diameter registration surface extending beyond an inner diameter of the insulator ring, a first outer diameter registration surface extending beyond an outer diameter of the inner insulator ring, and a second outer diameter registration surface extending beyond the outer diameter of the inner insulator ring, the inner diameter registration surface being configured to contact the outer diameter registration surface of the bottom insulator such that the inner insulator ring does not contact a vertical surface of the baseplate structure;
- an upper ring structure disposed around at least a portion of the puck, the upper ring structure having an innermost diameter registration surface configured to contact the second outer diameter registration surface of the inner insulator ring; and
- an outer insulator ring, the outer insulator ring having an inner diameter registration surface, the first outer diameter registration surface of the inner insulator ring being configured to contact the inner registration surface of the outer insulator ring such that a gap is formed between the outer diameter of the inner insulator ring and the inner diameter registration surface of the outer insulator ring.

11. The pedestal assembly of claim 10, wherein the upper ring structure has an outer diameter registration surface configured to contact an inner diameter registration surface associated with a focus ring.

\* \* \* \* \*